United States Patent
Ando et al.

(10) Patent No.: US 9,362,282 B1
(45) Date of Patent: Jun. 7, 2016

(54) HIGH-K GATE DIELECTRIC AND METAL GATE CONDUCTOR STACK FOR PLANAR FIELD EFFECT TRANSISTORS FORMED ON TYPE III-V SEMICONDUCTOR MATERIAL AND SILICON GERMANIUM SEMICONDUCTOR MATERIAL

(71) Applicant: INTERNATIONAL BUSINESS MACHINES CORPORATION, Armonk, NY (US)

(72) Inventors: Takashi Ando, Tuckahoe, NY (US); Martin M. Frank, Dobbs Ferry, NY (US); Pranita Kerber, Mount Kisco, NY (US); Vijay Narayanan, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/828,225

(22) Filed: Aug. 17, 2015

(51) Int. Cl.
| | |
|---|---|
| *H01L 27/092* | (2006.01) |
| *H01L 29/49* | (2006.01) |
| *H01L 29/51* | (2006.01) |
| *H01L 21/285* | (2006.01) |
| *H01L 29/40* | (2006.01) |
| *H01L 29/66* | (2006.01) |
| *H01L 21/28* | (2006.01) |
| *H01L 21/8258* | (2006.01) |
| *H01L 29/20* | (2006.01) |
| *H01L 29/16* | (2006.01) |

(52) U.S. Cl.
CPC ........ *H01L 27/092* (2013.01); *H01L 21/28088* (2013.01); *H01L 21/28556* (2013.01); *H01L 21/8258* (2013.01); *H01L 29/16* (2013.01); *H01L 29/20* (2013.01); *H01L 29/401* (2013.01); *H01L 29/4966* (2013.01); *H01L 29/517* (2013.01); *H01L 29/66545* (2013.01)

(58) Field of Classification Search
None
See application file for complete search history.

(56) References Cited

U.S. PATENT DOCUMENTS

| | | | |
|---|---|---|---|
| 7,432,567 | B2 | 10/2008 | Doris et al. |
| 7,863,126 | B2 | 1/2011 | Park et al. |
| 7,993,999 | B2 | 8/2011 | Basker et al. |
| 8,294,180 | B2 | 10/2012 | Doyle et al. |

(Continued)

FOREIGN PATENT DOCUMENTS

WO    2013/101007 A1    7/2013

OTHER PUBLICATIONS

Cheng et al. ("Metal Gates for Advanced Sub-80-nm SOI CMOS Technology," IEEE International SOI Conference, pp. 91-92, vol. 2, 2001).*

(Continued)

*Primary Examiner* — Yasser A Abdelaziez
(74) *Attorney, Agent, or Firm* — Tutunjian & Bitetto, P.C.; Vazken Alexanian

(57) ABSTRACT

An electrical device that includes a substrate including a first region of a type III-V semiconductor material and a second region of a type IV germanium containing semiconductor material. An n-type planar FET is present in the first region of the substrate. A p-type planar FET is present in a second region of the substrate. A gate structure for each of the n-type planar FET and the p-type planar FET includes a metal containing layer including at least one of titanium and aluminum atop a high-k gate dielectric. An effective work function of the gate structure for both the n-type and p-type planar FETs is a less than a mid gap of silicon.

11 Claims, 4 Drawing Sheets

(56) References Cited

U.S. PATENT DOCUMENTS

| | | | |
|---|---|---|---|
| 8,354,309 B2 | 1/2013 | Green et al. | |
| 8,466,473 B2 | 6/2013 | Cai et al. | |
| 8,486,770 B1 | 7/2013 | Wu et al. | |
| 8,828,818 B1 | 9/2014 | Rodder | |
| 8,836,049 B2 | 9/2014 | Tsai et al. | |
| 9,123,569 B1* | 9/2015 | Cheng | H01L 27/0922 |
| 2006/0172480 A1 | 8/2006 | Wang et al. | |
| 2011/0287620 A1* | 11/2011 | Xu | H01L 21/02181 |
| | | | 438/591 |
| 2013/0029463 A1* | 1/2013 | Illgen | H01L 21/823814 |
| | | | 438/199 |
| 2013/0105905 A1* | 5/2013 | Ji | H01L 21/28202 |
| | | | 257/369 |
| 2013/0105906 A1 | 5/2013 | Yin et al. | |
| 2013/0200454 A1 | 8/2013 | Anderson et al. | |
| 2013/0228864 A1 | 9/2013 | Mieno | |
| 2015/0228670 A1* | 8/2015 | Caimi | H01L 21/02532 |
| | | | 257/351 |

OTHER PUBLICATIONS

L. Czornomaz et al., "Co-integration of InGaAs n- and SiGe p-MOSFETs into digital CMOS circuits using hybrid dual-channel ETXOI substrates," International Electron Devices Meeting (IEDM), Dec. 9-11, 2013, pp. 2.8.1-2.8.4.

X. Zhang et al., "A gate-last In0.53Ga0.47 As channel FinFET with Molybdenum source/drain contacts," European, Solid-State Device Research Conference, ESSDERC, Sep. 17-21, 2012, pp. 177-180.

T. Maeda et al., "Scalable TaN metal source/drain & gate InGaAs/Ge n/pMOSFETs," 2011 Symposium on VLSI Technology Digest of Technical Papers, Jun. 2011, pp. 62-63.

M. Yokoyama et al., "CMOS integration of InGaAs nMOSFETs and Ge pMOSFETs with self-align Ni-based metal S/D using direct wafer bonding," 2011 Symposium on VLSI Technology Digest of Technical Papers, Jun. 2011, pp. 60-61.

S. Takagi et al., "High mobility material channel CMOS technologies based on heterogeneous integration," 11th International Workshop on Junction Technology (IWJT), Jun. 2011, pp. 1-6.

\* cited by examiner

HIGH-K GATE DIELECTRIC AND METAL GATE CONDUCTOR STACK FOR PLANAR FIELD EFFECT TRANSISTORS FORMED ON TYPE III-V SEMICONDUCTOR MATERIAL AND SILICON GERMANIUM SEMICONDUCTOR MATERIAL

CROSS REFERENCE TO RELATED APPLICATIONS

This application is related to Ser. No. 14/828,202, entitled "HIGH-K GATE DIELECTRIC AND METAL GATE CONDUCTOR STACK FOR FIN-TYPE FIELD EFFECT TRANSISTORS FORMED ON TYPE III-V SEMICONDUCTOR MATERIAL AND SILICON GERMANIUM SEMICONDUCTOR MATERIAL" which is incorporated herein in its entirety by reference.

FIELD OF THE INVENTION

The present disclosure relates generally to semiconductor devices, and more particularly to work function modifications in semiconductor devices.

BACKGROUND

Field effect transistors (FETs) are widely used in the electronics industry for switching, amplification, filtering and other tasks related to both analog and digital electrical signals. Most common among these are metal oxide semiconductor field effect transistors (MOSFET or MOS), in which a gate structure is energized to create an electric field in an underlying channel region of a semiconductor body, by which electrons are allowed to travel through the channel between a source region and a drain region of the semiconductor body. Complementary MOS (CMOS) devices have become widely used in the semiconductor industry, wherein both n-type and p-type (NMOS and PMOS) transistors are used to fabricate logic and circuitry.

Continuing trends in semiconductor device manufacturing include a reduction in electrical device feature size (scaling), as well as improvements in device performance in terms of device switching speed and power consumption. Some examples of methods to improve device switching include adjusting the work function of the materials in the gate structure.

SUMMARY

In one aspect of the present disclosure, an electrical device is provided that includes a planar FET semiconductor devices formed on type IV semiconductor surfaces including germanium (Ge) and type III-V semiconductor surfaces, in which the planar FETs are formed using gate first processing or gate last processing and use the substantially the same gate structures for n-type and p-type devices. In one embodiment that uses gate last processing, the electrical device includes a substrate including a first region of a type III-V semiconductor material and a second region of a type IV germanium containing semiconductor material. An n-type planar FET is present in the first region of the substrate, and a p-type planar FET is present in a second region of the substrate. A gate structure for each of the n-type planar FET and the p-type planar FET includes a metal containing layer including at least one of titanium and aluminum atop a high-k gate dielectric, wherein a work function of the gate structure for both the n-type and p-type planar FETs is a less than mid gap of silicon. In one embodiment, the mid gap of silicon is 4.65 eV.

A composition for the gate structure to the n-type planar FET may be substantially the same as a composition of the gate structure to the p-type planar FET, and in some embodiments, an effective work function for each of the n-type planar FET and the p-type planar FET ranges from 4.4 eV to 4.6 eV.

In some embodiments, the metal containing layer comprises titanium nitride. In other embodiments, the metal containing layer comprises a stack of a first titanium nitride on the high-k gate dielectric, a titanium aluminum carbide layer on the first titanium nitride layer, and a second titanium nitride layer on the titanium aluminum carbide layer, or the metal containing layer comprises a stack of a first titanium nitride on the high-k gate dielectric, a titanium aluminide layer on the first titanium nitride layer, and a second titanium nitride layer on the titanium aluminide layer.

In one example, the first and second gate structure further comprises an interface layer doped with group IIA or IIIB dopants between the high-k gate dielectric and the substrate.

In another aspect of the present disclosure, a method of forming an electrical device is provided that includes planar FETs that are formed using a gate first process. In one embodiment, the method may include providing a substrate including a first region of a type III-V semiconductor material and a second region of a type IV germanium containing semiconductor material. At least one gate stack is formed over the first and second region of the substrate, in which the gate stack includes an interface layer, a high-k gate dielectric layer, a metal nitride layer and a conductive electrode layer. The gate stack may be patterned to provide a first gate structure in the first region and a second gate structure in the second region of the substrate. N-type source and drain regions may be formed on opposing sides of the first gate structure for a planar n-type FET in the first region of the substrate; and p-type source and drain regions may be formed on opposing sides of the second gate structure for a planar p-type FET. An effective work function of the gate structure for both the n-type and p-type planar FETs is a less than mid gap of silicon.

In some examples, the metal nitride layer comprises titanium nitride deposited using atomic layer deposition (ALD) or Physical Vapor Deposition (PVD). The titanium nitride of the first gate structure and the second gate structure may be stoichiometrically tuned, by changing the Ti to N ratio during the PVD sputtering process, for appropriate work function shifts that result in an effective work function in the range of 4.4 eV to 4.6 eV. In some other embodiments, a composition of the gate structure to the n-type planar FET is substantially the same as a composition of the gate structure to the p-type planar FET. In some embodiments, the gate first processing may be conducted at temperatures less than 600° C.

In another aspect of the present disclosure, a method of forming an electrical device including planar FETs is provided that uses a gate last process sequence. The method may include providing a substrate including a first region of a type III-V semiconductor material and a second region of a type IV germanium containing semiconductor material. Replacement gate structures may be formed in the first and second regions of the substrate. N-type source and drain regions may be formed in the first region of the substrate and p-type source and drain regions may be formed in the second region of the substrate. The replacement gate structures may be substituted with functional gate structures. The functional gate structures may include a high-k gate dielectric and gate conductor including at least one aluminum containing layer in each of the first and second region of the substrate, wherein the work function for the gate structure for an n-type planar FET in the first region of the substrate and p-type planar FET is the second region of the substrate is less than a mid gap value of silicon.

In some examples, the gate conductor including the at least one aluminum containing layer includes a stack of a first titanium nitride on the high-k gate dielectric, a titanium aluminum carbide layer on the first titanium nitride layer, and a second titanium nitride layer on the titanium aluminum carbide layer, or the at least one aluminum containing layer includes a stack of a first titanium nitride on the high-k gate dielectric, a titanium aluminide layer on the first titanium nitride layer, and a second titanium nitride layer on the titanium aluminide layer.

DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION

Figure 1:
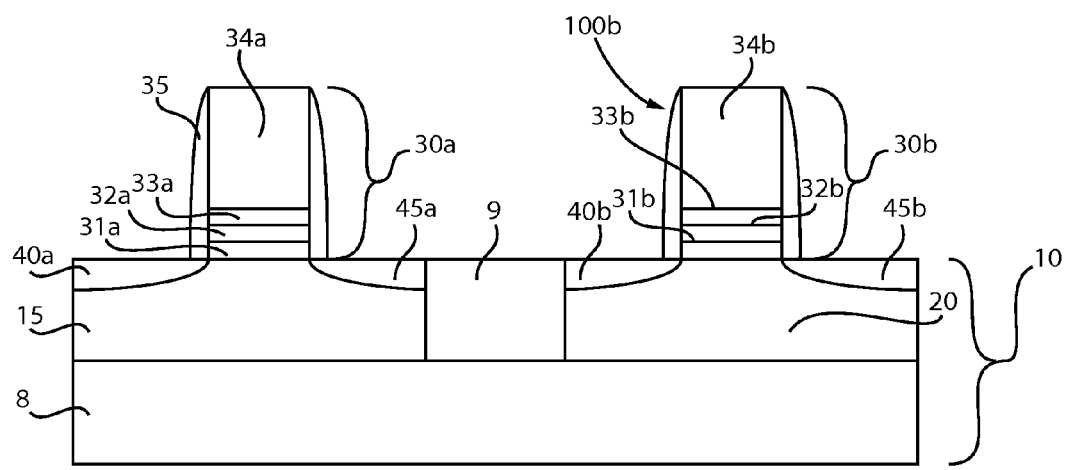
FIG. 1 is a side cross-sectional view depicting a planar n-type field effect transistor (FET) on a first portion of a substrate composed of a type III-V semiconductor material, and a planar p-type field effect transistor (FET) on a second portion of the substrate composed of a germanium containing material, in which the n-type and p-type field effect transistors include work function adjustments and are formed using gate first methods, in accordance with one embodiment of the present disclosure.

Detailed embodiments of the methods and structures of the present disclosure are described herein; however, it is to be understood that the disclosed embodiments are merely illustrative of the disclosed methods and structures that may be embodied in various forms. In addition, each of the examples given in connection with the various embodiments of the disclosure are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The present disclosure is related to forming complementary metal oxide semiconductor (CMOS) devices, in which the p-type conductivity semiconductor devices, e.g., planar field effect transistors (FETs), are formed on a silicon and germanium containing semiconductor surface, such as silicon germanium (SiGe), and the n-type conductivity semiconductor devices, e.g., planar field effect transistors (FETs), are formed on a type III-V semiconductor surface, e.g., indium gallium arsenide (InGaAs), in which the gate structures of the n-type and p-type semiconductor devices have had work function adjustments. As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. In the following description, the semiconductor device is a field effect transistor. Complementary metal oxide semiconductor (CMOS) is a type of semiconductor that use both N-type (negative polarity) and P-type (positive polarity) semiconductor circuits. Typically, since only one of the circuit types is on at any given time, CMOS chips require less power than chips using just one type of transistor. A "field effect transistor" is a transistor in which output current, i.e., source-drain current, is controlled by the voltage applied to a gate structure. A field effect transistor typically has three terminals, i.e., a gate structure, source region and drain region. As used herein, the term "source" is a doped region in the semiconductor device, in which majority carriers are flowing into the channel. As used herein, the term "channel" is the region underlying the gate structure and between the source and drain of a semiconductor device that becomes conductive when the semiconductor device is turned on. As used herein, the term "drain" means a doped region in semiconductor device located at the end of the channel, in which carriers are flowing out of the transistor through the drain. A "gate structure" means a structure used to control output current (i.e., flow of carriers in the channel) of a semiconducting device through electrical or magnetic fields.

The term "planar" as used to describe a semiconductor device orientation, e.g., planar FET, denotes that the direction of charge carriers from the source region to the drain region of the semiconductor device is along a plane that is parallel to the upper surface of the substrate, wherein a gate structure is present on the upper surface of the substrate. In a planar semiconductor device, the gate structure does not wrap around the sidewalls of the channel region as in a fin structure.

The term "work function" is used to describe a gate electrode material that determines the threshold voltage of a semiconductor device. For example, a work function adjustment effectuates a threshold voltage shift either towards the valence band or conduction band. As used herein, "threshold voltage" is the lowest attainable gate voltage that will turn on a semiconductor device, e.g., transistor, by making the channel of the device conductive. A "valence band" is the highest range of electron energies where electrons are normally present at absolute zero.

The "conduction band" is the lowest lying electron energy band of the doped material that is not completely filled with electrons.

It has been determined that III-V nFET/SiGe pFET CMOS devices can require specific work function engineering, i.e., work function adjustments, to enable the appropriate functioning planar FET devices due to the different affinities of type III-V semiconductors, such as indium gallium arsenide (InGaAs) and germanium containing semiconductors, such as silicon germanium (SiGe), in comparison to conventional silicon (Si) substrates, e.g., single crystalline-Si (c-Si).

In some embodiments, the methods and structures disclosed herein provide a single metal high-k metal gate stack to enable planar dual channel CMOS devices using III-V nFETs and SiGe pFETs (planar nFET and planar pFET). In some examples of CMOS arrangements including planar FETs, both the nFET and pFET gate stacks, require effective work functions (EWF) ranging from 4.4 to 4.6 eV for planar dual channel CMOS. The effective work function is defined relative to the vacuum level and extracted using measured C-V curves on silicon (Si), i.e., EWF of the gate stack is extracted from a CV curve of the gate stack deposited on silicon, and includes the work function of the electrode along with fixed charges and dipoles within the dielectric.

FIG. 1 depicts a planar n-type field effect transistor (FET) 100a on a first portion 15 of a substrate 10 that is composed of a type III-V semiconductor material, and a planar p-type field effect transistor (FET) 100b on a second portion 20 of the substrate 10 that is composed of a germanium containing material. The n-type and p-type field effect transistors 100a, 100b each include work function adjustments and are formed using a gate first method. The first portion 15 of the substrate 10 may be separated from the second portion 20 of the substrate 10 by an isolation region 9, such as a shallow trench isolation (STI) regions, which in one example can be composed of silicon oxide ($SiO_2$).

The term "III-V semiconductor material" denotes a semiconductor material that includes at least one element from Group IIIB of the Periodic Table of Elements under the Old International Union of Pure and Applied Chemistry (IUPAC) classification system, or Group 13 of the New International Union of Pure and Applied Chemistry classification system; and at least one element from Group VB of the Periodic Table of Elements, or Group 15 of the New International Union of Pure and Applied Chemistry classification system. In some embodiments, the III-V semiconductor material that is present in the first portion 15 of the substrate may be selected from the group of (AlSb), aluminum arsenide (AlAs), aluminum nitride (AlN), aluminum phosphide (AlP), gallium arsenide (GaAs), gallium phosphide (GaP), indium antimonide (InSb), indium arsenic (InAs), indium nitride (InN), indium phosphide (InP), aluminum gallium arsenide (AlGaAs), indium gallium phosphide (InGaP), aluminum indium arsenic (AlInAs), aluminum indium antimonide (AlInSb), gallium arsenide nitride (GaAsN), gallium arsenide antimonide (GaAsSb), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), indium arsenide antimonide phosphide (InArSbP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide aluminum antimonide (GaInNAsSb), gallium indium arsenide antimonide phosphide (GaInAsSbP), and combinations thereof. The germanium containing material that provides the second portion 20 of the substrate 10 may be substantially 100 at. % germanium (Ge), e.g., greater than 95 at % germanium (Ge), such as 99 at. % germanium (Ge), silicon germanium (SiGe), silicon germanium doped with carbon (SiGe:C) or combinations thereof. It is noted that in one example, the III-V semiconductor material that provides the first portion 15 of the substrate 10 is $In_{0.53}Ga_{0.47}As$, and the germanium containing material that provides the second portion 20 of the substrate 10 is silicon germanium (SiGe) having greater than 50 at. % germanium. It is noted that the above atomic percent that are provide to describe the material of the first and second portions 15, 20 of the substrate describe a base material, i.e., intrinsic semiconductor, which does not include a measurement of the dopants that provided the conductivity type of the device, e.g., whether the FET is a p-type or n-type FET.

Each of the n-type and p-type field effect transistors 100a, 100b include a gate structure having work function adjustments, which in some embodiments provides an effective work function ranging from 4.3 to 4.7 eV for each of the n-type and p-type field effect transistors 100a, 100b. The n-type field effect transistor 100a may include a first gate structure 30a that includes a first interface dielectric layer 31a formed on the channel region of the first portion 15 of the substrate 10; a first high-k gate dielectric layer 32a that is present on the first interface dielectric layer 31a; a first metal work function adjusting layer 33a that is present on the first high-k gate dielectric layer 32a; and a first conductive electrode 34a. The p-type field effect transistor 100b may include a second gate structure 30b that includes a second interface dielectric layer 31b formed on the channel region of the second portion 20 of the substrate 10; a second high-k gate dielectric layer 32b that is present on the second interface dielectric layer 31b; a second metal work function adjusting layer 33b that is present on the second high-k gate dielectric layer 32b; and a second conductive electrode 34b.

The first and second interface dielectric layer 31a, 31b may be an oxide, such as silicon oxide ($SiO_2$). In some embodiments, the first and second interface dielectric layers 31a, 31b may also be provided by a doped dielectric material. For example, the first and second interface dielectric layers 31a, 31b may be comprised of a silicon containing layer and a layer containing a dopant selected from Group IIA or Group IIIB of the periodic table of elements under the Old International Union of Pure and Applied Chemistry (IUPAC) classification system. Examples of dielectric dopants may be selected from the group consisting of beryllium (Be), magnesium (Mg), barium (Ba), lanthanum (La), yttrium (Y) and combinations thereof. For example, at least one of the first and second interface dielectric layer 31a, 31b may be composed of lanthanum oxide ($La_2O_3$). The thickness for each of the first and second interface dielectric layer 31a, 31b may range from 1 Å to 10 Å. In some examples, the thickness for each of the first and second interface dielectric layers 31a, 31b may be on the order of 2 Å to 6 Å.

The term "high-k" as used to describe the first and second high-k gate dielectric layers 32a, 32b denotes a dielectric material having a dielectric constant greater than silicon oxide ($SiO_2$) at room temperature (20° C. to 25° C.) and atmospheric pressure (1 atm). For example, a high-k dielectric material may have a dielectric constant greater than 4.0. In another example, the high-k gate dielectric material has a dielectric constant greater than 7.0. In some embodiments, the first and second high-k gate dielectric layers 32a, 32b are composed of a hafnium-based dielectric. The term 'Hf-based dielectric' is intended herein to include any high k dielectric containing hafnium (Hf). Examples of such Hf-based dielectrics comprise hafnium oxide ($HfO_2$), hafnium silicate (Hf-$SiO_x$), Hf silicon oxynitride (HfSiON) or multilayers thereof. In some embodiments, the Hf-based dielectric comprises a mixture of $HfO_2$ and $ZrO_2$ or rare earth oxide such as $La_2O_3$. MgO or MgNO can also be used. Typically, the Hf-based dielectric is hafnium oxide or hafnium silicate. Hf-based dielectrics typically have a dielectric constant that is greater than about 10.0. In one embodiment, the thickness for each of the first and second high-k gate dielectric layers 32a, 32b is greater than 0.8 nm. More typically, the at least one first gate dielectric layer 13 has a thickness ranging from about 1.0 nm to about 6.0 nm.

The first and second gate structures 30a, 30b may be formed using a single metal electrode, i.e., first and second metal work function adjusting layer 33a, 33b and first and second conductive electrode 34a, 34b, for both of the first and second gate structures 30a, 30b. By single metal electrode it is meant that the composition for both the first and metal work function adjusting layers 33a, 33b, as well as the composition for both of the first and second gate electrode 34a, 34b, is the same. For example, the first and second metal work function adjusting layers 33a, 33b may each be composed of metal nitride, such as titanium nitride (TiN). In some examples, stoichiometry tuning of titanium nitride (TiN) may be used to for fine tuning the work function adjustments provided by the first and second metal work function adjusting layers 33a, 33b. Stoichiometric tuning can be accomplished by adjusting the titanium (Ti) to nitrogen (N) ratio during the physical vapor deposition (PVD) sputtering program for forming the material layer. Although titanium nitride (TiN) is described above as an embodiment of a material suitable for the first and second metal work function adjusting layers, other metal nitrides may be suitable for use with the present disclosure. For example, the metal layers may further comprise aluminum. In other examples, the first and second metal work function adjusting layers may include other metals from Groups IVB to VIB in the Periodic Table, including, e.g., tantalum nitride (TaN), niobium nitride (NbN), vanadium nitride (VN), tungsten nitride (WN), and the like with a thickness of about 20 Angstroms to about 30 Angstroms.

The conductive electrodes 34a, 34b may be composed of any metal containing material. For example, the conductive electrodes 34a, 34b may be composed of tungsten (W) or a tungsten including alloy. In other examples, the conductive electrodes 34a, 34b are composed of aluminum (Al), copper (Cu), platinum (Pt), silver (Ag) or an alloy thereof including allows with tungsten (W).

The first and second gate structures 30a, 30b is suitable for activation anneals for the source and drain regions of the n-type planar FET 100a and the p-type planar FET 100b at temperatures of greater than 500° C. and less than 600° C. for gate first processing.

Still referring to FIG. 1, a gate sidewall spacer 35 is present on each of the gate structures 30a, 30b. The gate sidewall spacer 35 may be composed of any dielectric material, such as silicon oxide or silicon nitride.

The n-type planar FET 100a includes n-type dopants in the first portion 15 of the substrate 10 for the source region 40a and drain region 45a that are positioned on opposing sides of the first gate structure 30a. In some embodiments, a n-type dopant in a type III-V semiconductor material, such as InGaAs, can be element from Group IIA or VIA of the Periodic Table of Elements). As used herein, "n-type" refers to the addition of impurities that contributes free electrons to an intrinsic semiconductor. In some embodiments, the dopant for providing an n-type device in a type III-V semiconductor material may be from Group IV of the periodic table of elements, such as silicon. Dopant atoms from group IV, such a silicon (Si), have the property that they can act as acceptors or donor depending on whether they occupy the site of group III or group V atoms respectively.

The p-type planar FET 100b includes p-type dopants in the second portion 20 of the substrate 10 for the source region 40b and drain region 45b that are positioned on opposing sides of the second gate structure 30b. As used herein, "p-type" refers to the addition of impurities to an intrinsic semiconductor that creates deficiencies of valence electrons. In a type IV semiconductor surface, such as the germanium containing second portion 20, e.g., silicon germanium (SiGe) second portion 20, of the substrate, examples of p-type dopants, i.e., impurities, include but are not limited to boron, aluminum, gallium and indium. The p-type dopant within the source and drain regions 40b, 45b is typically present in a concentration ranging from about $10^{11}$ to about $10^{15}$ atoms/cm$^2$, with a concentration of dopant within the doped region from about $10^{11}$ to about $10^{13}$ atoms/cm$^2$ being more typical.

Although not depicted in the supplied figures the source and drain regions 40a, 40b, 45a, 45b for the p-type planar FET 100b and the n-type planar FET 100a may further include raised source and drain regions. Raised source and drain regions may include in-situ doped epitaxially formed semiconductor material that is formed on the upper surface of the substrate 10 in which the source and drain regions 40a, 40b, 45a, 45b are present.

Referring to FIG. 1, in some embodiments, the first gate structure 30a to the n-type planar semiconductor device 100a is composed of a first conductive electrode 34a of tungsten (W), a first metal work function layer 33a of titanium nitride (TiN), a first high-k gate dielectric layer 32a of hafnium oxide ($HfO_2$), and an interface oxide of silicon oxide ($SiO_2$), in which the first gate structure 30a is present on a first portion 15 of the substrate 10 that is composed of $In_{0.53}Ga_{0.47}As$, and the effective work function for the first gate structure 30a to the n-type planar semiconductor device 100a ranges from 4.4 eV to 4.6 eV. The p-type planar semiconductor device 100b is present on the same substrate 10 as the n-type planar semiconductor device 100a. The p-type planar semiconductor device 100b may have the same gate structure as the first gate structure 30a for the n-type planar semiconductor device 100a. In one example, the second gate structure 30b to the p-type planar semiconductor device 100b is composed of a second conductive electrode 34b of tungsten (W), a second metal work function layer 33b of titanium nitride (TiN), a second high-k gate dielectric layer 32b of hafnium oxide ($HfO_2$), and an interface layer 31b of silicon oxide ($SiO_2$), in which the first gate structure 30b is present on a second portion 20 of the substrate 10 that is composed of silicon germanium (SiGe) having a germanium (Ge) concentration that is greater than 50 at. %, and the effective work function for the first gate structure 30a to the p-type planar semiconductor device 100b ranges from 4.4 eV to 4.6 eV.

In another embodiment, the aforementioned effective work functions (EWF) can be provided for each of the p-type planar semiconductor device and the n-type planar semiconductor device using a titanium nitride (TiN) atomic layer deposition (ALD) formed material layer for the first and second metal work function adjusting layers 33a, 33b in combination with a first and second interface layer 31a, 31b comprising doping with Group IIA and/or Group IIIB dielectric doping.

Although the semiconductor devices described herein are field effect transistors (FETs), the present disclosure is equally applicable to any semiconductor device that exhibits a change in conductivity in response to the application of a threshold voltage.

The CMOS device depicted in FIG. 1 may be formed using a gate first process that is described with reference to FIGS. 2-5.

Figure 2:
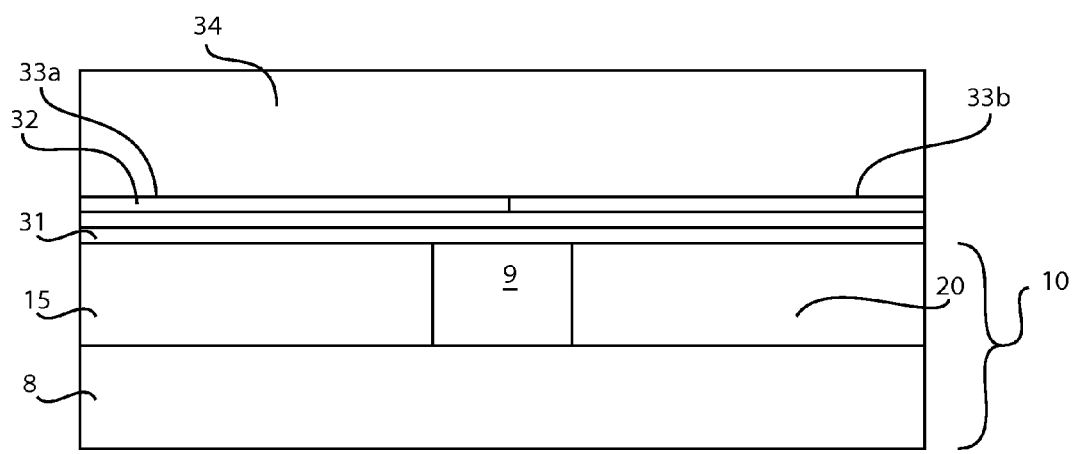
FIG. 2 is a side cross-sectional view depicting forming the material layers for a first gate structure and a second gate structure to a substrate having a first portion composed of type III-V semiconductor material and a second portion composed of a germanium containing semiconductor material, in accordance with one embodiment.

FIG. 2 depicts one embodiment of forming the material layers for a first gate structure 30a and a second gate structure 30b on a substrate 10 having a first portion 15 composed of type III-V semiconductor material and a second portion 20 composed of a germanium containing semiconductor material. The different compositions of the first and second portions 15, 20 of the substrate 10 can be formed using epitaxial growth, layer transfer, bonding, and deposition processes to position the different composition materials on a base substrate 8, such as a bulk silicon wafer. The isolation regions 9 separating the first portion 15 of the substrate 10 from the second portion 20 of the substrate 10 can be formed by etching a trench utilizing a dry etching process, such as reactive-ion etching (RIE) or plasma etching. A deposition process is used to fill the trench with oxide grown from tetraethylorthosilicate (TEOS) precursors, high-density oxide or another like trench dielectric material. After trench dielectric fill, the structure may be subjected to a planarization process.

The interface layer 31 may be formed using a thermal oxidation method. For example, when the interface layer 31 is composed of silicon oxide it can be formed using thermal oxidation. In the embodiments, in which the interface layer 31 is formed with a group IIA or group IIIB dielectric doping layer, the interface layer 31 may be formed using a deposition method, such as chemical vapor deposition (CVD) or atomic layer deposition (ALD). Variations of CVD processes suitable for forming the interface layer 31 include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed.

In the embodiment depicted in FIG. 2, the interface layer 31 is a single layer having the same composition for both of the first and second portions 15, 20 of the substrate 10. Embodiments have been contemplated, in which the composition of the interface layer 31 that is present on the first portion 15 of the substrate 10 is different than the composition of the interface layer 31 that is present on the second portion 20 of the substrate 10. The different portions, i.e., first and second portion 15, 20, of the substrate 10 may be independently processed by forming a first block mask over one portion of the substrate and processing the exposed portion, followed by removing the first block mask, forming a second block mask over the previously processed portion and processing the newly exposed portion.

The high-k gate dielectric layer 32 can be formed by a thermal growth process such as, for example, oxidation, nitridation or oxynitridation. The high-k gate dielectric layer 32 can also be formed by a deposition process such as, for example, chemical vapor deposition (CVD), plasma-assisted CVD, metal-organic chemical vapor deposition (MOCVD), atomic layer deposition (ALD), evaporation, reactive sputtering, chemical solution deposition and other like deposition processes. The high-k gate dielectric layer 32 may also be formed utilizing any combination of the above processes. The high-k gate dielectric layer 32 typically has a thickness ranging from 1 nm to 10 nm. In one example, the high-k gate dielectric layer 32 has a thickness ranging from 2 nm to 5 nm. The high-k gate dielectric layer 32 may be composed of a single composition high-k dielectric layer that provides the same composition for the first and second high-k gate dielectric layers 32a, 32b following gate patterning.

Referring to FIG. 2, following formation of the high-k gate dielectric layer 32, the first and second metal work function adjusting layers 33a, 33b may be formed. In one embodiment, a work function metal layer comprising titanium nitride (TiN) may be deposited by a physical vapor deposition (PVD) method, such as sputtering. Examples of sputtering apparatus that may be suitable for depositing the work function metal layer include DC diode type systems, radio frequency (RF) sputtering, magnetron sputtering, and ionized metal plasma (IMP) sputtering. In addition to physical vapor deposition (PVD) techniques, the p-type work function metal layer may also be formed using chemical vapor deposition (CVD) and atomic layer deposition (ALD).

In some embodiments, the first and second metal work function adjusting layers 33a, 33b can be formed with the deposition of a single layer of work function adjusting material. In this example, the composition of the first metal work function layer 33a is the same as the composition of the second metal work function layer 33b. In the example that is depicted in FIG. 2, the composition of the first metal work function layer 33a can be different than the composition of the second metal work function layer 33b. The different portions, i.e., first and second portion 15, 20, of the substrate 10 may be independently processed to provide a first metal work function layer 33a having a different than the composition of the second metal work function layer 33b by forming a first block mask over one portion of the first and second portions 15, 20 of the substrate 10 and processing the exposed portion. Once one of the first and second metal work function layer 33a, 33b is formed on the substrate, the first block mask is removed. A second block mask may be formed over the portion of the substrate in which the work function metal layer was previously formed leaving another portion of the substrate exposed. A second work function metal layer may then be formed on the exposed portion of the substrate. The second block mask may then be removed. The block masks may be soft masks, e.g., photoresist masks, or the block masks may be hard masks, e.g., a mask composed of a nitride or oxide material.

In one embodiment, each of the first and second metal work function adjusting layers 33a, 33b may be formed of titanium nitride with stoichiometric tuning to provide the appropriate work function adjustments for the n-type field effect transistor 100a and the p-type field effect transistor 100b. Stoichiometric tuning can be accomplished by adjusting the titanium (Ti) to nitrogen (N) ratio during the physical vapor deposition (PVD) sputtering program for forming the material layer. In some embodiments, the titanium nitride layers may be formed using atomic layer deposition (ALD).

Still referring to FIG. 2, a conductive electrode layer 34 may be formed on the first and second metal work function layers 33a, 33b. The conductive electrode layer 34 may be blanket deposited overlying both the first and second metal work function layers 33a, 33b. The conductive electrode layer 34 may be deposited using a physical vapor deposition method. For example, the conductive electrode layer 34 may be deposited using plating, electroplating, electroless plating, sputtering and combinations thereof. Examples of sputtering apparatus that may be suitable for depositing the work function metal layer include DC diode type systems, radio frequency (RF) sputtering, magnetron sputtering, and ionized metal plasma (IMP) sputtering. In addition to physical vapor deposition (PVD) techniques, the conductive electrode layer 34 may also be formed using chemical vapor deposition (CVD).

Figure 3:
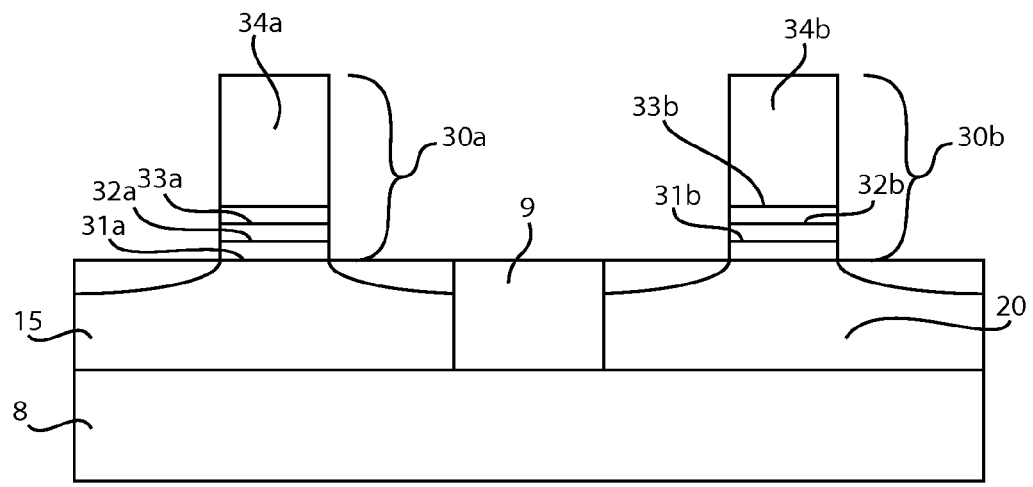
FIG. 3 is a side cross-sectional view depicting patterning the material layers to provide a first gate structure in the first portion of the substrate, and a second gate structure in the second portion of the substrate.

FIG. 3 is depicts patterning the material layers depicted in FIG. 2 to provide a first gate structure 30a in the first portion 15 of the substrate 10, and a second gate structure 30b in the second portion 20 of the substrate 10. The patterned gate structures 30a, 30b are formed utilizing photolithography and etch process steps. Specifically, a pattern is produced by applying a photoresist to the surface to be etched; exposing the photoresist to a pattern of radiation; and then developing the pattern into the photoresist utilizing conventional resist developer. Once the patterning of the photoresist is completed, the sections covered by the photoresist are protected while the exposed regions are removed using a selective etching process that removes the unprotected regions. As used herein, the term "selective" in reference to a material removal process denotes that the rate of material removal for a first material is greater than the rate of removal for at least another material of the structure to which the material removal process is being applied. The etch process for etching the exposed portions of the interface layer 31, the high-k gate dielectric layer 32, the first and second metal work function layers 33a, 33b, and the conductive electrode layer 34 may include an anisotropic etch, such as reactive ion etching (RIE). Following the etch process, the remaining portions of the interface layer provide the first and second interface layer 31a, 31b, the remaining portions of the high-k dielectric layer provide the first and second high-k dielectric layer 32a, 32b, and the remaining portions of the conductive electrode layer 34 provide the first and second conductive electrodes 34a, 34b.

Figure 4:
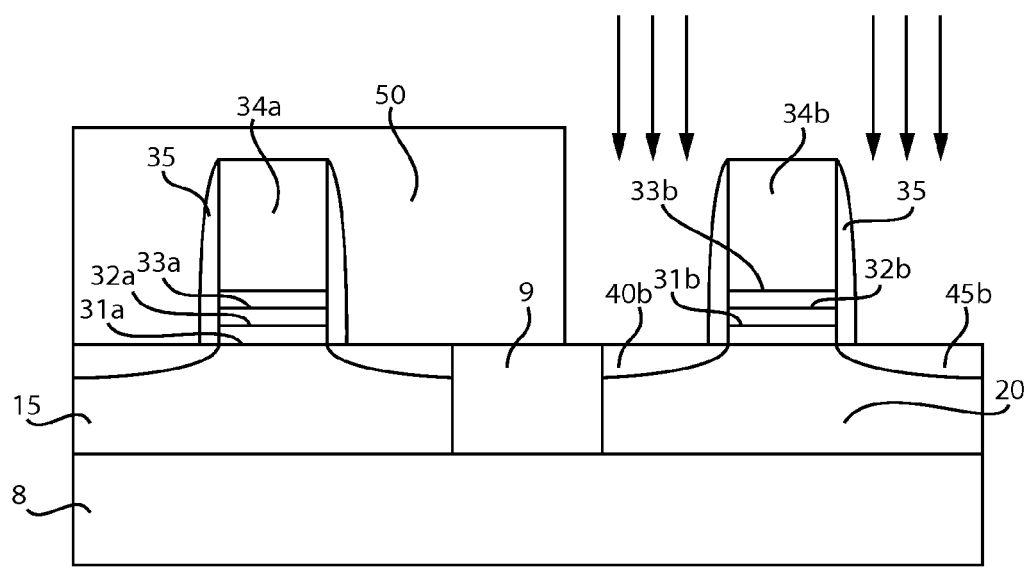
FIG. 4 is a side cross-sectional view depicting forming a block mask over the first portion of the substrate, and forming p-type source and drain regions in the second portion of the substrate, in accordance with one embodiment of the present disclosure.

Referring to FIG. 4, a gate sidewall spacer 35 may then be formed on each of the first and second gate structures 30a, 30b. The gate sidewall spacer 35 may be composed of oxide, i.e., $SiO_2$, but may also comprise nitride or oxynitride materials. Each gate sidewall spacer 35 may have a width ranging from 50.0 nm to 100.0 nm. The gate sidewall spacer 35 can be formed by deposition and etch processes.

FIG. 4 further depicts implanting dopants into the second portion 20 of the substrate 10 to provide a p-type source region 40b and a p-type drain region 45b. The source regions 40a, 40b and drain regions 45a, 45b for the planar semiconductor devices are formed ion implantation. In the embodiment that is depicted in FIG. 4, a block mask 50 is formed over the first portion 15 of the substrate 10 in which the n-type source region 40a, and p-type drain region 45a is formed. After the p-type source region 40b and p-type drain region 45b is formed in the second region 20 of the substrate 10, the n-type source region 40a and n-type drain region 45a can then be formed in the first portion 15 of the substrate 10. This can begin with removing the block mask 50, and forming another block mask (not shown) over the second portion 20 of the substrate 10, in which the p-type source region 40a and the p-type drain region 45b have been formed. The block mask that is formed over the second portion 20 of the substrate 10 leaves the first portion 15 of the substrate 10 exposed. The n-type source region 40a and n-type drain region 40b may then be formed in the first portion 15 of the substrate 10.

Although FIG. 4 only depicts forming source and drain regions within the surface of the first and second portions 15, 20 of the substrate 10. The present disclosure is not limited to only this example. For example, raised source and drain regions may be present on the upper surfaces of the first and second portions 15, 20 on opposing sides of the gate structures 30a, 30b. The raised source and drain regions may be formed of epitaxially deposited semiconductor material and may have the same dopant conductivity as the source and drain region 40a, 40b, 45a, 45b that the epitaxial material is formed on.

Following formation of the source and drain regions 40a, 40b, 45a, 45b they may be activated using an activation anneal. For example, the anneal process may include a temperature greater than 500° C.

The above process sequence can provide the CMOS device depicted in FIG. 1, including a first gate structure 30a to the n-type planar semiconductor device 100a that is composed of a first conductive electrode 34a of tungsten (W), a first metal work function layer 33a of titanium nitride (TiN), a first high-k gate dielectric layer 32a of hafnium oxide ($HfO_2$), and an interface oxide of silicon oxide ($SiO_2$), in which the first gate structure 30a is present on a first portion 15 of the substrate 10 that is composed of $In_{0.53}Ga_{0.47}As$, and the effective work function for the first gate structure 30a to the n-type planar semiconductor device 100a ranges from 4.4 eV to 4.6 eV. The p-type planar semiconductor device 100b is present on the same substrate 10 as the n-type planar semiconductor device 100a. The p-type planar semiconductor device 100b may have the same gate structure as the first gate structure 30a for the n-type planar semiconductor device 100a. In one example, the second gate structure 30b to the p-type planar semiconductor device 100b is composed of a second conductive electrode 34b of tungsten (W), a second metal work function layer 33b of titanium nitride (TiN), a second high-k gate dielectric layer 32a of hafnium oxide (HfO$_2$), and an interface oxide of silicon oxide (SiO$_2$), in which the first gate structure 30b is present on a second portion 20 of the substrate 10 that is composed of silicon germanium (SiGe) having a germanium (Ge) concentration that is greater than 50 at. %, and the effective work function for the first gate structure 30a to the n-type planar semiconductor device 100a ranges from 4.4 eV to 4.6 eV.

Figure 5:
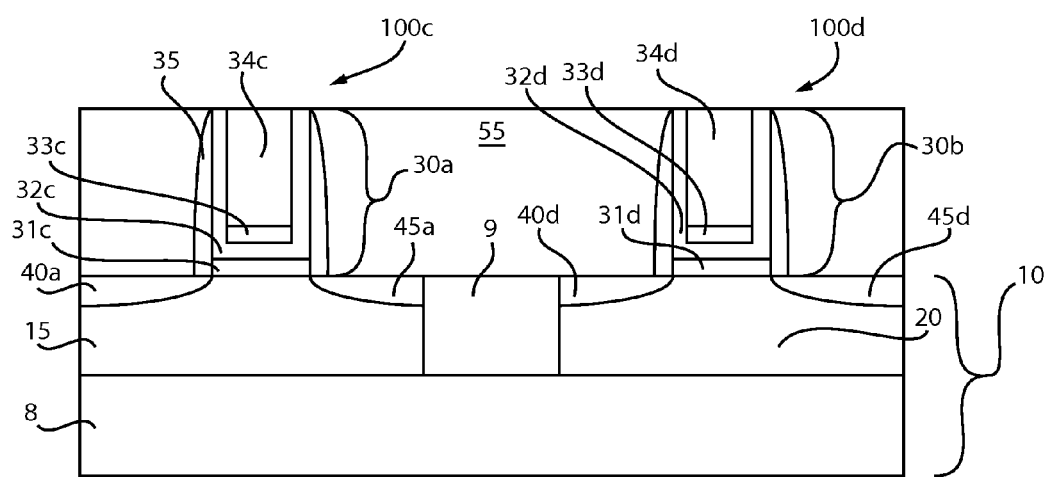
FIG. 5 is a side cross-sectional view depicting a planar n-type field effect transistor (FET) on a first portion of a substrate composed of a type III-V semiconductor material, and a planar p-type field effect transistor (FET) on a second portion of the substrate composed of a germanium containing material, in which the n-type and p-type field effect transistors include work function adjustments and are formed using gate last methods, in accordance with one embodiment of the present disclosure.

The present disclosure also provide methods and structures for providing work function adjustments for CMOS devices having planar n-type FETs formed on III-V semiconductor materials, and planar p-type FETs formed on germanium containing semiconductor materials using gate last processing, which may also be referred to as replacement gate processing or replacement metal gate (RMG) processing. FIG. 5 depicts one embodiment of a planar n-type field effect transistor (FET) 100c on a first portion 15 of a substrate 10 composed of a type III-V semiconductor material, and a planar p-type field effect transistor (FET) 110d on a second portion 20 of the substrate 10 composed of a germanium containing material, in which the n-type and p-type field effect transistors include work function adjustments and are formed using gate last methods.

The substrate 10 that is depicted in FIG. 5 has been described above with reference to FIG. 1. Therefore, the description of the substrate 10 including the description of the first portion 15 and the second portion 20, as well as the base substrate 8 and the isolation region 9, that has been provided above with reference to FIG. 1 is suitable for the description of these similarly labeled elements in FIG. 5. For example, in one embodiment, the first portion 15 of the substrate 10 depicted in FIG. 5 is composed of a type III-V semiconductor material, such as In$_{0.53}$Ga$_{0.47}$As, and the second portion 20 of the substrate 10 is composed of a germanium (Ge) containing material, such as silicon germanium (SiGe) with greater than 50 at % Germanium (Ge). The work function adjustments made using the first and second gate structures 30a, 30b depicted in FIG. 5 that are provided in the present disclosure can produce an effective work function (EWF) for each of the n-type and p-type planar FETs 100c, 100d that ranges from 4.3 eV to 4.7 eV.

Similar to the n-type field effect transistor 100a that is depicted in FIG. 1., the n-type field effect transistor 100c depicted in FIG. 5 may include a first gate structure 30a that includes a first interface dielectric layer 31c formed on the channel region of the first portion 15 of the substrate 10; a first high-k gate dielectric layer 32c that is present on the first interface dielectric layer 31a; a first metal work function adjusting layer 33c that is present on the first high-k gate dielectric layer 32c; and a first conductive electrode 34c.

The description of the first interface dielectric layer 31a, and the first conductive electrode 34a, of the n-type field effect transistor 100a that is depicted in FIG. 1 is suitable for the description of the first interface dielectric layer 31c, and the first conductive electrode 34c that is depicted in FIG. 5. The first high-k dielectric layer 32c that is depicted in FIG. 5 includes a horizontal base portion and two vertical sidewall portions, which result from the gate last process for forming the gate structures. With the exception of the U-shaped geometry of the first high-k gate dielectric layer 32c that is depicted in FIG. 5, the description of the first high-k gate dielectric layer 32a that is depicted in FIG. 1 is suitable for the description of the first high-k gate dielectric layer 32c that is depicted in FIG. 5. For example, the first high-k gate dielectric layer 32c may be composed of hafnium oxide (HfO$_2$).

The first metal work function adjusting layer 33c that is present in the first gate structure 30a to the n-type planar FET 100c formed using gate last processing may be a composite layer, i.e., a multi-layered structure, including at least one aluminum (Al) containing layer. For example, the first metal work function adjusting layer 33c may be composed of a first layer of titanium nitride (TiN) that is present on the first high-k dielectric layer 32c, a second layer of titanium aluminum carbide (TiAlC) that is present on the first layer of titanium nitride (TiN), and a third layer of titanium nitride (TiN) that is present on the second layer of titanium aluminum carbide (TiAlC). In another example, the first metal work function adjusting layer 33c may be composed of a first layer of titanium nitride (TiN) that is present on the first high-k dielectric layer 32c, a second layer of titanium aluminide (TiAl) that is present on the first layer of titanium nitride (TiN), and a third layer of titanium nitride (TiN) that is present on the second layer of titanium aluminide (TiAl). The thickness of each layer in the composite layer that provides the first metal work function adjusting layer may range from about 10 Angstroms to about 60 Angstroms.

Similar to the p-type field effect transistor 100b that is depicted in FIG. 1., the p-type field effect transistor 100d depicted in FIG. 5 may include a second gate structure 30b that includes a second interface dielectric layer 31d formed on the channel region of the second portion 20 of the substrate 10; a second high-k gate dielectric layer 32d that is present on the second interface dielectric layer 31d; a second metal work function adjusting layer 33d that is present on the second high-k gate dielectric layer 32d; and a second conductive electrode 34d.

The description of the second interface dielectric layer 31b, and the second conductive electrode 34b, of the p-type field effect transistor 100b that is depicted in FIG. 1 is suitable for the description of the second interface dielectric layer 31d, and the second conductive electrode 34d that is depicted in FIG. 5. The second high-k dielectric layer 32d that is depicted in FIG. 5 includes a horizontal base portion and two vertical sidewall portions, which result from the gate last process. With the exception of the U-shaped geometry of the second high-k gate dielectric layer 32d that is depicted in FIG. 5, the description of the second high-k gate dielectric layer 32b that is depicted in FIG. 1 is suitable for the description of the second high-k gate dielectric layer 32d that is depicted in FIG. 5. For example, the second high-k gate dielectric layer 32d may be composed of hafnium oxide (HfO$_2$).

The second metal work function adjusting layer 33d that is present in the second gate structure 30b to the p-type planar FET 100d formed using gate last processing may be a composite layer, i.e., a multi-layered structure, including at least one aluminum (Al) containing layer. For example, the second metal work function adjusting layer 33d may be composed of a first layer of titanium nitride (TiN) that is present on the second high-k dielectric layer 32d, a second layer of titanium aluminum carbide (TiAlC) that is present on the first layer of titanium nitride (TiN), and a third layer of titanium nitride (TiN) that is present on the second layer of titanium aluminum carbide (TiAlC). In another example, the second metal work function adjusting layer 33d may be composed of a first layer of titanium nitride (TiN) that is present on the second high-k dielectric layer 32d, a second layer of titanium aluminide (TiAl) that is present on the first layer of titanium nitride (TiN), and a third layer of titanium nitride (TiN) that is present on the second layer of titanium aluminide (TiAl). The thickness of each layer in the composite layer that provides the second metal work function adjusting layer 33d may range from about 30 Angstroms to about 60 Angstroms.

The composition of each material layer in the first gate structure 30a may be the same as the composition of each material layer in the second gate structure 30b. In some embodiments, the composition of at least one material layer in the first gate structure 30a may be different from the composition of at least one material layer in the second gate structure 30b.

Referring to FIG. 5, a gate sidewall spacer 35 is present on each of the gate structures 30a, 30b. The gate sidewall spacer 35 may be composed of any dielectric material, such as silicon oxide or silicon nitride. The p-type planar FET 100b includes p-type dopants in the second portion 20 of the substrate 10 for the source region 40b and drain region 45b that are positioned on opposing sides of the second gate structure 30b. The n-type planar FET 100a includes n-type dopants in the first portion 15 of the substrate 10 for the source region 40a and drain region 45a that are positioned on opposing sides of the first gate structure 30a. Further details regarding the dopants used to provide the source and drain regions 40a, 40b, 45a, 45b are provided above in the description of FIG. 1. Although not depicted in FIG. 5, the source and drain regions 40a, 40b, 45a, 45b for the p-type planar FET 100d and the n-type planar FET 100c may further include raised source and drain regions.

Still referring to FIG. 5, an interlevel dielectric layer 55 is present overlying the source and drain regions 40a, 40b, 45a, 45b and has an upper surface that is coplanar with an upper surface of the first and second gate structures 30a, 30b. As will be described below, the interlevel dielectric 55 is formed prior to removing a replacement gate structure, also referred to as sacrificial gate structure. The first and second gate structures 30a, 30b are formed after the replacement gate structures are removed, and the u-shaped geometry is indicative of the gate last methodology.

Referring to FIG. 5, in some embodiments, the first gate structure 30a to the n-type planar semiconductor device 100c is composed of a first conductive electrode 34c of tungsten (W), a first metal work function layer 33c that is a composite of TiN/TiAlC/TiN or a composite of TiN/TiAl/TiN, a first high-k gate dielectric layer 32c of hafnium oxide (HfO2), and an interface oxide of silicon oxide ($SiO_2$), in which the first gate structure 30a is present on a first portion 15 of the substrate 10 that is composed of In0.53Ga0.47As, and the effective work function for the first gate structure 30a to the n-type planar semiconductor device 100c ranges from 4.4 eV to 4.6 eV. The p-type planar semiconductor device 100d is present on the same substrate 10 as the n-type planar semiconductor device 100c, as depicted in FIG. 5. The p-type planar semiconductor device 100d may have the same gate structure as the first gate structure 30a for the n-type planar semiconductor device 100c. In one example, the second gate structure 30b to the p-type planar semiconductor device 100d is composed of a second conductive electrode 34d of tungsten (W), a second metal work function layer 33d that is a composite of TiN/TiAlC/TiN or a composite of TiN/TiAl/TiN, a second high-k gate dielectric layer 32d of hafnium oxide ($HfO_2$), and an interface oxide 31d of silicon oxide ($SiO_2$), in which the second gate structure 30b is present on a second portion 20 of the substrate 10 that is composed of silicon germanium (SiGe) having a germanium (Ge) concentration that is greater than 50 at. %, and the effective work function for the first gate structure 30a to the n-type planar semiconductor device 100a ranges from 4.4 eV to 4.6 eV.

The CMOS device depicted in FIG. 2 may be formed using a gate last process that is described with reference to FIGS. 6-8.

Figure 6:
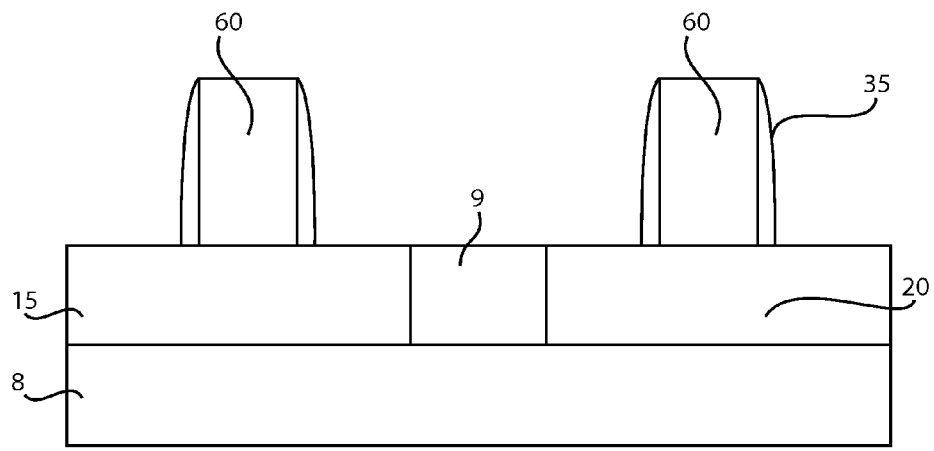
FIG. 6 is a side cross-sectional view depicting forming replacement gate structures on a first portion of a substrate that is comprised of a type III-V semiconductor material and second portion of the substrate that is comprised of a germanium containing semiconductor material, in accordance with one embodiment of the present disclosure.

FIG. 6 depicts forming replacement gate structures 60 on a first portion 15 of a substrate 10 that is comprised of a type III-V semiconductor material and second portion 20 of the substrate 10 that is comprised of a germanium containing semiconductor material. In some embodiments, the replacement gate structures 60 that are depicted in FIG. 6 are formed of a semiconductor material, such as polysilicon. But, in other embodiments, the replacement gate structures 60 may be composed of a dielectric material. The replacement gate structures 60 may be formed using deposition, photolithography and etching processes, similar to the functional gate structures that are described above with reference to FIG. 2. The replacement gate structures 60 are formed to have a geometry that matches the geometry of the later formed functional gate structures.

Figure 7:
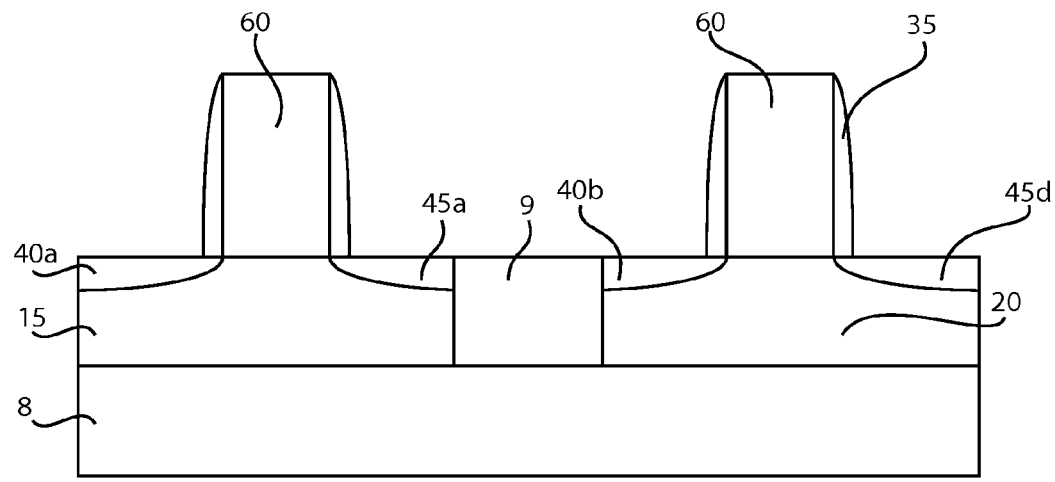
FIG. 7 is a side cross-sectional view depicting forming n-type source and drain regions in a first portion of the substrate, and forming p-type source and drain regions in a second portion of the substrate, in accordance with one embodiment of the present disclosure.

FIG. 7 depicts forming n-type source and drain regions 40a, 45a in the first portion 15 of the substrate 10, and forming p-type source and drain regions 40b, 45b in a second portion 20 of the substrate 10. The source and drain regions 40a, 40b, 45a, 45b depicted in FIG. 7 may be formed using ion implantation while the replacement gate structures 60 are present on the substrate 10. The source and drain regions 40a, 40b, 45a, 45b that are depicted in FIG. 7 are similar to the source and drain regions 40a, 40b, 45a, 45b that are depicted in FIGS. 1, 4 and 5. Therefore, the above description of the source and drain regions 40a, 40b, 45a, 45b that are depicted in FIGS. 1, 4 and 5 is suitable for providing further details regarding the source and drain regions 40a, 40b, 45a, 45b that are depicted in FIG. 7.

The method may continue with activating the source and drain regions 40a, 40b, 45a, 45b. Activation of the source and drain regions 40a, 40b, 45a, 45b may be done with the replacement gate structure present on the substrate 10. This provides that the later formed functional gate structure is not subjected to the high temperature anneal process. Further details regarding the activation anneal have been described above with reference to FIGS. 1-4.

Figure 8:
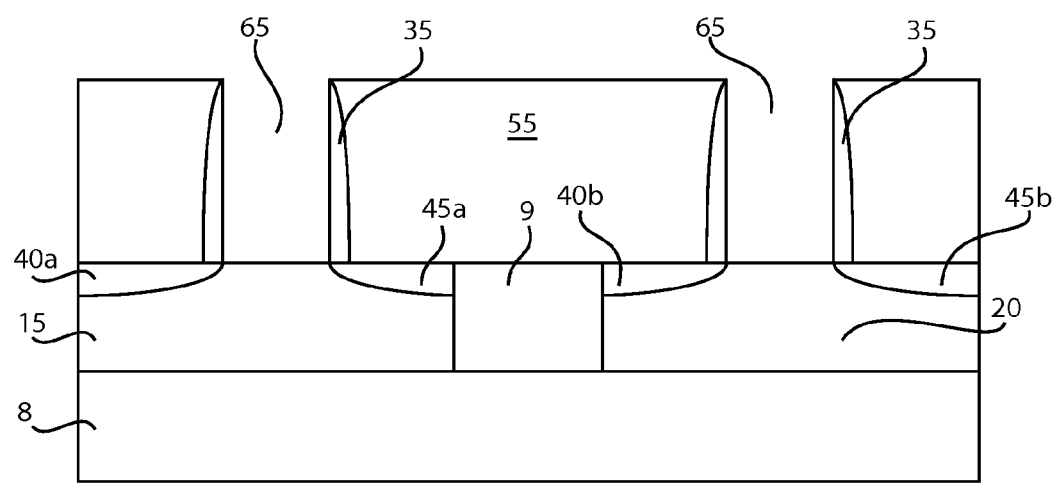
FIG. 8 is a side cross-sectional view depicting forming an interlevel dielectric layer over the structure depicted in FIG. 7, and removing the first and second replacement gate structures, in accordance with one embodiment of the present disclosure.

FIG. 8 depicts one embodiment of forming an interlevel dielectric layer 55 over the structure depicted in FIG. 7, and removing the first and second replacement gate structures 60. The interlevel dielectric layer 55 may be deposited on the structure depicted in FIG. 7, using chemical solution deposition, spin on deposition, chemical vapor deposition or a combination thereof. The interlevel dielectric layer 55 may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). Additional choices for the interlevel dielectric layer include any of the aforementioned materials in porous form, or in a form that changes during processing to or from being porous and/or permeable to being non-porous and/or non-permeable. Following deposition, the interlevel dielectric layer 55 may be planarized to provide an upper surface that is coplanar with an exposed upper surface of the replacement gate structures 60. In one example, the planarization process is chemical mechanical planarization (CMP). Once, the replacement gate structures 60 are exposed, they may be removed using a selective etch process.

After the replacement gate structures 60 are removed, gate openings 65 are present to the channel regions of the first portion 15 of the substrate 10 and the second portion 15 of the substrate 10. The gate openings 65 may then be filled with the material layers that provide the function gate structures for each of the n-type planar FET 100c and the p-type planar FET 100d, as depicted in FIG. 5. For example, each interface layer 31c, 31d may be provided by thermal growth or chemical vapor deposition. The high-k gate dielectrics 32c, 32d may be formed using chemical vapor deposition (CVD), such as plasma enhanced chemical vapor deposition (PECVD). Thereafter, the first metal work function layer 33c and the second metal work function metal layer 33d may be formed using a deposition method, such as atomic layer deposition (ALD) or physical vapor deposition (PVD). Examples of physical vapor deposition (PVD) used to form each of the first and second metal work function layer 33c, 33d can include sputtering methods or plating methods. The first and second conductive electrodes 34c, 34d may be deposited using a physical vapor deposition (PVD) method, such as plating, e.g., electroplating. It is noted that in the embodiments, in which the composition of the first gate structure 30a is the same as the second gate structure 30b, the materials layers for both gate structures may be formed simultaneously. In some embodiments, the material layers for one of the gate structures 30a, 30b may be formed independently than the material layers in the other gate structures 30a, 30b. This can be accomplished using block masks, as described in the above embodiments. By employing block masks, at least one of the material layers for the first gate structure 30a may have a composition that is different than the material layers in the second gate structure 30b.

In some embodiments, the gate last process flow that is illustrated with reference to FIGS. 5-8 may employ a tungsten fill for the first and second conductive electrodes 34a, 34b with a 400° C. process flow. In a replacement gate process flow, i.e., gate last process flow, the electrodes are not chemically or thermally stable for temperatures greater than 400° C., and can lead to unwanted threshold voltage shifts.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

The invention claimed is:

1. A method of forming an electrical device including planar FETs using a gate first process comprising:
    providing a substrate including a first region of a type III-V semiconductor material and a second region of a type IV germanium containing semiconductor material;
    forming at least one gate stack comprising an interface layer, a high-k gate dielectric layer, a metal nitride layer and a conductive electrode layer over the first and second region of the substrate;
    patterning the gate structure to provide a first gate structure in the first region and a second gate structure in the second region; and
    forming n-type source and drain regions on opposing sides of the first gate structure for a planar n-type FET in the first region of the substrate and p-type source and drain regions on opposing sides of the second gate structure for a planar p-type FET, wherein a work function of the gate structure for both the n-type and p-type planar FETs is a less than mid gap of silicon.

2. The method of claim 1, wherein the metal nitride layer comprises titanium nitride deposited using atomic layer deposition (ALD).

3. The method of claim 1, wherein the metal nitride layer comprises titanium nitride, and wherein the titanium nitride of the first and second gate structure is stoichiometrically tuned to achieve an effective work function in a range of 4.4 eV-4.6 eV.

4. The method of claim 1, wherein a composition of the first gate structure to the n-type planar FET is substantially the same as a composition of the second gate structure to the p-type planar FET.

5. The method of claim 1, wherein an effective work function for each of the n-type planar FET and the p-type planar FET ranges from 4.4 eV to 4.6 eV.

6. A method of forming an electrical device including planar FETs using a gate last process comprising:
    providing a substrate including a first region of a type III-V semiconductor material and a second region of a type IV germanium containing semiconductor material;
    forming replacement gate structures in the first and second regions of the substrate;
    forming n-type source and drain regions in the first region of the substrate and p-type source and drain regions in the second region of the substrate; and
    replacing the replacement gate structures with functional gate structures comprising a high-k gate dielectric and gate conductor including at least one aluminum containing layer in each of the first and second region of the substrate, wherein an effective work function for the gate structure for an n-type planar FET in the first region of the substrate and p-type planar FET is the second region of the substrate is less than a mid gap value of silicon.

7. The method of claim 6, wherein the effective work function for each of the n-type planar FET and the p-type planar FET ranges from 4.4 eV to 4.6 eV.

8. The method of claim 6, wherein the gate conductor including the at least one aluminum containing layer comprises a stack of a first titanium nitride on the high-k gate dielectric, a titanium aluminum carbide layer on the first titanium nitride layer, and a second titanium nitride layer on the titanium aluminum carbide layer, or the at least one aluminum containing layer comprises a stack of a first titanium nitride on the high-k gate dielectric, a titanium aluminide layer on the first titanium nitride layer, and a second titanium nitride layer on the titanium aluminide layer.

9. The method of claim 6 further comprising a conductive electrode atop the gate conductor for the functional gate structures to the n-type planar FET and the p-type planar FET, wherein a composition of the conductive electrode to the n-type planar FET is substantially the same as a composition of the conductive electrode to the p-type planar FET.

10. The method of claim 6 further comprising an interfacial layer between the high-k gate dielectric of each of the functional gate structures and the substrate.

11. The method of claim 6, wherein the type IV germanium containing semiconductor material is silicon germanium (SiGe) or germanium (Ge).

* * * * *